US009269861B2

(12) United States Patent
Lee et al.

(10) Patent No.: US 9,269,861 B2
(45) Date of Patent: Feb. 23, 2016

(54) LIGHT EMITTING DEVICE PACKAGE AND LIGHTING DEVICE FOR VEHICLE INCLUDING THE SAME

(71) Applicant: LG INNOTEK CO., LTD., Seoul (KR)

(72) Inventors: Gun Kyo Lee, Seoul (KR); In Yong Park, Seoul (KR); Dae Hee Lee, Seoul (KR); Yun Min Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/472,514

(22) Filed: Aug. 29, 2014

(65) Prior Publication Data

US 2015/0062949 A1  Mar. 5, 2015

(30) Foreign Application Priority Data

Aug. 30, 2013 (KR) .................. 10-2013-0103830
Aug. 30, 2013 (KR) .................. 10-2013-0103831

(51) Int. Cl.

| | | |
|---|---|---|
| *H01L 33/08* | (2010.01) | |
| *H01L 27/15* | (2006.01) | |
| *F21K 99/00* | (2010.01) | |
| *F21S 8/10* | (2006.01) | |
| *F21V 23/00* | (2015.01) | |
| *H01L 25/075* | (2006.01) | |

(Continued)

(52) U.S. Cl.
CPC . *H01L 33/08* (2013.01); *F21K 9/50* (2013.01); *F21S 48/2212* (2013.01); *F21V 23/005* (2013.01); *H01L 27/156* (2013.01); *H01L 33/50* (2013.01); *H01L 25/0753* (2013.01); *H01L 33/20* (2013.01); *H01L 33/504* (2013.01); *H01L 33/508* (2013.01); *H01L 2224/48091* (2013.01); *H01L 2224/48227* (2013.01); *H01L 2224/73265* (2013.01)

(58) Field of Classification Search
CPC ........ H01L 33/50; H01L 33/08; H01L 27/156
USPC ............................................. 257/98
See application file for complete search history.

(56) References Cited

U.S. PATENT DOCUMENTS

| | | | |
|---|---|---|---|
| 2002/0015013 A1* | 2/2002 | Ragle .............................. | 345/82 |
| 2011/0175128 A1* | 7/2011 | Lee et al. ......................... | 257/98 |

(Continued)

FOREIGN PATENT DOCUMENTS

| | | | |
|---|---|---|---|
| EP | 2367203 A1 | 9/2011 | |
| EP | 2573451 A1 | 3/2013 | |

(Continued)

*Primary Examiner* — Nathan Ha
(74) *Attorney, Agent, or Firm* — Birch, Stewart, Kolasch & Birch, LLP (57) ABSTRACT

Embodiments relate to a light emitting device package including a package body, a light emitting structure disposed on the package body, the light emitting structure including a first conductive semiconductor layer, an active layer and a second conductive semiconductor layer, the light emitting structure being divided into at least two light emitting cells, a support substrate located between the package body and the light emitting structure, a first electrode and a second electrode connected to each of the light emitting cells and fluorescent substances disposed respectively on the light emitting cells. At least two layers among the first conductive semiconductor layer, the active layer and the second conductive semiconductor layer included in each of the light emitting cells next to each other are electrically separated from each other.

19 Claims, 10 Drawing Sheets

(51) Int. Cl.
　　*H01L 33/20*　　(2010.01)
　　*H01L 33/50*　　(2010.01)

(56) References Cited

U.S. PATENT DOCUMENTS

2011/0233575 A1*　9/2011　Huang et al. .................... 257/89
2012/0161184 A1*　6/2012　Ubahara et al. ................ 257/98

FOREIGN PATENT DOCUMENTS

| EP | 2778511 A2 | 9/2014 |
| JP | 11-204832 A | 7/1999 |
| JP | 2012-19104 A | 1/2012 |
| KR | 10-2010-0098463 A | 9/2010 |
| WO | WO 2005/022654 A2 | 3/2005 |
| WO | WO 2010/020068 A1 | 2/2010 |

* cited by examiner

LIGHT EMITTING DEVICE PACKAGE AND LIGHTING DEVICE FOR VEHICLE INCLUDING THE SAME

CROSS REFERENCE TO RELATED APPLICATION

This application claims priority under 35 U.S.C. §119 to Korean Patent Application No. 10-2013-0103830, filed in Korea on Aug. 30, 2013, and No. 10-2013-0103831, filed in Korea on Aug. 30, 2013, which are hereby incorporated in its entirety by reference as if fully set forth herein.

TECHNICAL FIELD

Embodiments relate to light emitting device packages and lighting devices for vehicles including the same.

BACKGROUND

Light emitting devices, such as Light Emitting Diodes (LEDs) or Laser Diodes (LDs), which use group III-V or group II-VI compound semiconductors, are capable of emitting light of various colors, such as red, green and blue, ultraviolet light and the like, owing to developments of device materials and thin film growth technologies. Moreover, these light emitting devices are capable of emitting white light with high efficiency through use of a fluorescent substance or color combination, and have advantages of low power consumption, semi-permanent lifespan, fast response time, safety and environmental friendliness as compared to conventional light sources, such as fluorescent lamps, incandescent lamps and the like.

Accordingly, application sectors of light emitting devices are expanded up to transmitting modules of optical communication means, LED backlights to replace Cold Cathode Fluorescence Lamps (CCFLs) which serve as backlights of Liquid Crystal Display (LCD) apparatuses, white LED lighting apparatuses to replace fluorescent lamps or incandescent lamps, head lights of vehicles and traffic lights.

A light emitting device includes a light emitting structure including a first conductive semiconductor layer, an active layer and a second conductive semiconductor layer sequentially stacked on a substrate formed of sapphire or the like, and a first electrode and a second electrode are respectively disposed on the first conductive semiconductor layer and the second conductive semiconductor layer.

A light emitting device package includes a first electrode and a second electrode disposed on the top of a package body and a light emitting device disposed on the bottom of the package body, the first electrode and the second electrode being electrically connected to each other.

Figure 1A:
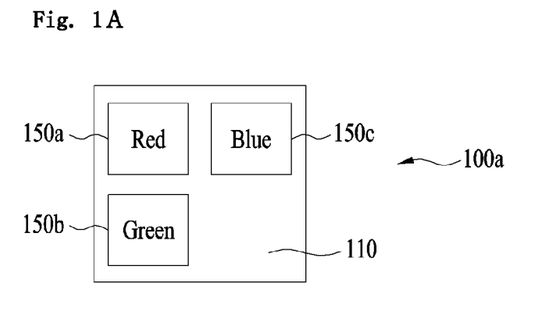
FIGS. 1A and 1B are views showing conventional light emitting device packages.
Figure 1B:
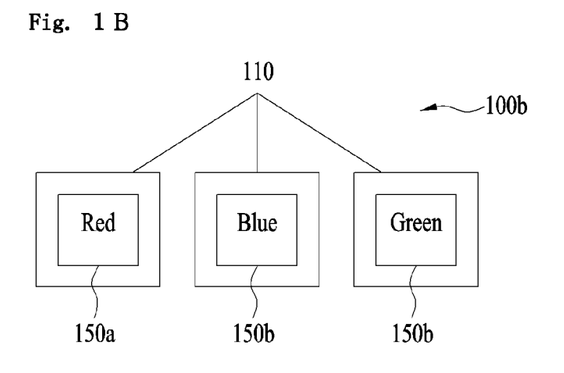

FIGS. 1A and 1B are views showing conventional light emitting device packages.

In case of a light emitting device package 100 provided with a plurality of light emitting devices 150a, 150b and 150c, the light emitting devices 150a, 150b and 150c are arranged on a substrate 110 and spaced apart from one another by a prescribed distance. The light emitting devices 150a, 150b and 150c may emit light of the same wavelength range or light of different wavelength ranges.

For example, when attempting to white light from a light emitting device package, as exemplarily shown in FIG. 1A, three light emitting devices 150a, 150b and 150c to emit red, green and blue light of different wavelength ranges respectively may be arranged on a single substrate 110. Alternatively, the three light emitting devices 150a, 150b and 150c to emit red, green and blue light of different wavelength ranges may be arranged respectively on different substrates 110.

In this case, the three light emitting devices 150a, 150b and 150c may emit light of different wavelength ranges from active layers thereof, or may include different kinds of fluorescent substances disposed on the active layers that emit light of the same wavelength range.

When a plurality of light emitting devices to emit light of different wavelength ranges is used in a single light emitting device package as described above, design limits and increase in cost may be expected.

In particular, in case of rear lighting devices for vehicles that are adapted to emit light of various colors in various shapes within a narrow space, there may be technical limits with regard to close arrangement of light emitting devices to emit light of different wavelength ranges.

Figure 2:
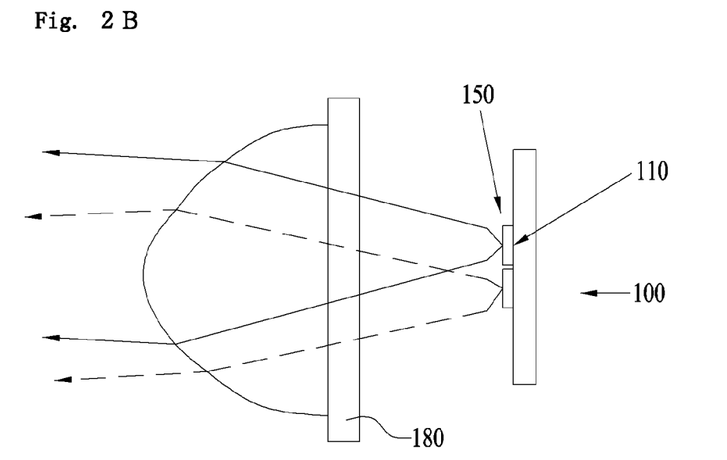
FIG. 2A is a view showing a conventional light emitting device package.
FIG. 2B is a view showing a conventional light source module.
Figure 2A:
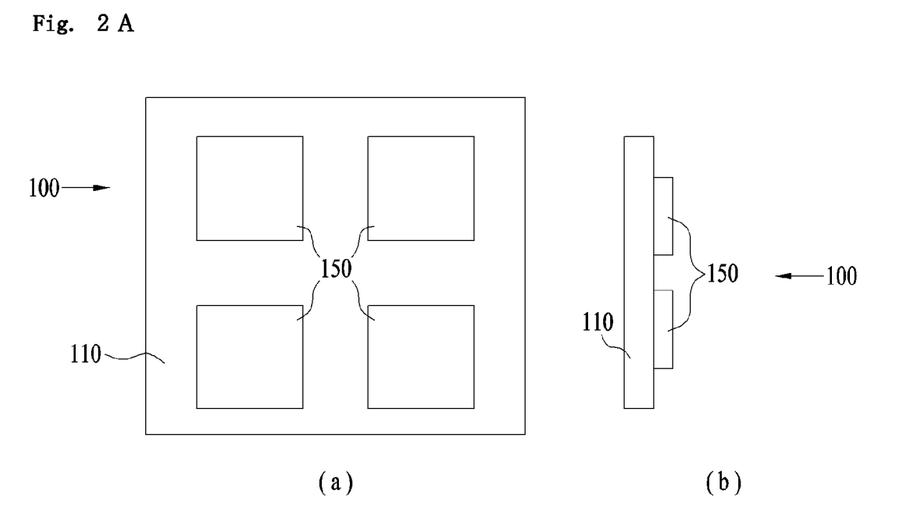

FIG. 2A is a view showing a conventional light emitting device package.

In case of a light emitting device package 100 provided with a plurality of light emitting devices 150, the light emitting devices 150 are arranged on a substrate 110 and spaced apart from one another by a prescribed distance. The respective light emitting devices 150 may emit light of the same wavelength range or light of different wavelength ranges.

FIG. 2B is a view showing a conventional light source module.

In the shown light source module, a lens 180 may be located in front of the light emitting device package 100 and serve to change a progress path of light emitted from the respective light emitting devices 150. In particular, when used in lighting devices for vehicles, the lens 180 may be an aspheric lens that directly transmits light from the light emitting devices 150 and, thus, the shape of light sources of the light emitting devices 150 may be important.

However, light sources of light emitting devices typically have a rectangular or square shape and are limited in the emission shape of light to be transmitted outward. In addition, there may be technical limits with regard to close arrangement of respective light emitting devices.

SUMMARY

Embodiments provide light emitting device packages and lighting devices for vehicles including the same, which achieve an increased degree of freedom in terms of arrangement of light sources, diversification in the emission shape of light to be transmitted outward from light sources and reduced manufacturing costs.

In one embodiment, a light emitting device package includes a package body, a light emitting structure disposed on the package body, the light emitting structure including a first conductive semiconductor layer, an active layer and a second conductive semiconductor layer, the light emitting structure being divided into at least two light emitting cells, a support substrate located between the package body and the light emitting structure, a first electrode and a second electrode connected to each of the light emitting cells and fluorescent substances disposed respectively on the light emitting cells, wherein at least two layers among the first conductive semiconductor layer, the active layer and the second conductive semiconductor layer included in each of the light emitting cells next to each other are electrically separated from each other.

The respective light emitting cells may emit light of the same wavelength range, and at least some portions of the fluorescent substances disposed respectively on the light emitting cells may emit light of different wavelength ranges.

The light emitting cells may be formed by growing a single light emitting structure and then dividing the grown light emitting structure via etching.

The fluorescent substances may take the form of a conformal coating or a film.

A distance of the light emitting cells next to each other may be 10 μm to 50 μm.

The light emitting device package may further include a substrate for placement of the light emitting structure, and each of the light emitting cells may be mesa-etched such that the second conductive semiconductor layer, the active layer and a portion of the first conductive semiconductor layer are etched to expose a portion of the first conductive semiconductor layer, and the second electrode and the first electrode may be respectively disposed on the second conductive semiconductor layer in an unetched region and the exposed first conductive semiconductor layer in an etched region of the light emitting cell.

The light emitting device package may further include a conductive support substrate for placement of the light emitting structure, and the first electrode may be disposed on the first conductive semiconductor layer of each of the light emitting cells.

In another embodiment, a lighting device for a vehicle includes a circuit board, a light emitting device package as described above disposed on the circuit board, and a lens disposed on the light emitting device package, wherein the at least one light emitting structure includes two or more light emitting structures, each of the light emitting structures is configured to emit light of a blue wavelength range, and the respective light emitting cells are provided with at least a yellow fluorescent substance and a red fluorescent substance.

Each of the light emitting structures may include a first light emitting cell provided with the yellow fluorescent substance and a second light emitting cell provided with a red fluorescent substance, and the first light emitting cell and the second light emitting cell in the light emitting structure may be equally arranged.

The first light emitting cell and the second light emitting cell may be driven independently of each other.

In a further embodiment, a light emitting device package includes a package body, at least one light emitting structure disposed on the package body, the light emitting structure including a first conductive semiconductor layer, an active layer and a second conductive semiconductor layer, the light emitting structure being divided into at least two light emitting cells, a first electrode and a second electrode connected to each of the light emitting cells and fluorescent substances disposed respectively on at least some portions of the light emitting cells, wherein the light emitting cells differ from one another in terms of at least one of a shape of the cells and a distance between the cells.

The respective light emitting cells may have a square shape or a triangular shape.

The active layers of the respective light emitting cells may emit light of the same wavelength range, and at least some portions of the fluorescent substances disposed respectively on the light emitting cells may emit light of different wavelength ranges.

The light emitting cells may include a first light emitting cell provided with a first fluorescent substance to emit light of a first wavelength range and a second light emitting cell provided with a second fluorescent substance to emit light of a second wavelength range, and at least one of the first light emitting cell and the second light emitting cell may indicate a specific emblem.

The light emitting cells having different shapes may be provided with fluorescent substances to emit light of the same wavelength range or light of different wavelength ranges.

The light emitting cells having the same shape may be provided with fluorescent substances to emit light of the same wavelength range or light of different wavelength ranges.

The light emitting cells may be formed by growing a single light emitting structure and then dividing the grown light emitting structure via etching.

The fluorescent substances may take the form of a conformal coating or a film.

The at least one light emitting structure may include a first light emitting structure and a second light emitting structure, and some light emitting cells in the first light emitting structure and some light emitting cells in the second light emitting structure may indicate a direction indicating emblem.

Some light emitting cells in the first light emitting structure and some light emitting cells in the second light emitting structure may indicate a break signal emblem.

BRIEF DESCRIPTION OF THE DRAWINGS

Arrangements and embodiments may be described in detail with reference to the following drawings in which like reference numerals refer to like elements and wherein:

FIGS. 13A and 133 are views showing a manufacturing process of the light emitting cells shown in FIGS. 12A and 12B.

DESCRIPTION OF SPECIFIC EMBODIMENTS

Hereinafter, embodiments to concretely realize the above object will be described with reference to the accompanying drawings.

In the following description of the embodiments, it will be understood that, when each element is referred to as being formed "on" or "under" the other element, it can be directly "on" or "under" the other element or be indirectly formed with intervening one or more other elements therebetween. Also, it will also be understood that "on" or "under" the element may mean an upward direction and a downward direction of the element.

In the drawings, the thickness or size of each layer may be exaggerated, omitted or schematically illustrated for clarity and convenience. In addition, the size of each constituent element does not wholly reflect an actual size thereof.

Figure 3:
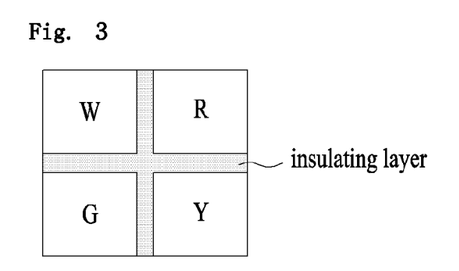
FIG. 3 is a view schematically showing a configuration of light emitting cells in a light emitting device package according to an embodiment.

FIG. 3 is a view schematically showing a configuration of light emitting cells in a light emitting device package according to an embodiment.

In the light emitting device package according to the embodiment, a single light emitting device may be divided into a plurality of light emitting cells, e.g., four light emitting cells W, R, G and Y as exemplarily shown in FIG. 3, and the respective light emitting cells W, R, G and Y may be separated from one another with an insulating layer interposed between the light emitting cells W, R, G and Y. The aforementioned light emitting cells may be formed by growing a single light emitting structure and dividing the same by etching. Since the single light emitting structure emits light of the same wavelength range, the respective light emitting cells may be respectively provided with fluorescent substances to emit light of different wavelength ranges. In this manner, the florescent substances on the light emitting cells are separated from one another by the insulating layer.

Figure 4:
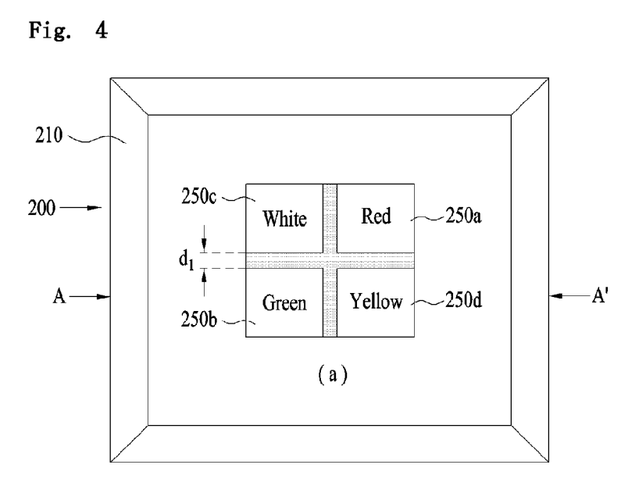
FIG. 4 is a view showing a first embodiment of a light emitting device package.

FIG. 4 is a view showing a first embodiment of a light emitting device package.

The light emitting device package 200 according to the present embodiment includes a single light emitting device disposed on a package body, such as, e.g. a substrate 210. Alternatively, a plurality of light emitting devices may be disposed, and at least one light emitting device may be divided into a plurality of light emitting cells.

In FIG. 4, a single light emitting device may be divided into four light emitting cells 250a to 250d and the respective light emitting cells may emit red, green, white and yellow light of different wavelength ranges. To allow the respective light emitting cells 250a to 250d to emit light of different wavelength ranges, a light emitting structure emits light of the same wavelength range and the respective light emitting cells 250a to 250d are provided with different fluorescent substances. The fluorescent substances may emit light of different wavelength ranges when excited by the above-described light of the same wavelength range and, in turn, the respective light emitting cells 250a to 250d may emit light of different wavelength ranges.

For example, when an active layer of the light emitting device emits light of a blue wavelength range, the first light emitting cell 250a may be provided with a fluorescent substance that is excited by light of the blue wavelength range to emit light of a wavelength range between 550 nm and 565 nm, the second light emitting cell 250b may be provided with a fluorescent substance that is excited by light of the blue wavelength range to emit light of a wavelength range between 620 nm and 650 nm, the third light emitting cell 250c may be provided with a fluorescent substance that is excited by light of the blue wavelength range to emit light of a wavelength range between 510 nm and 540 nm, and the fourth light emitting cell 250d may be provided with a fluorescent substance that is excited by light of the blue wavelength range to emit light of a wavelength range between 590 nm and 600 nm.

The light emitting cells 250a to 250d are separated from each other and spaced apart from one another by a predetermined distance dl. The predetermined distance dl may be within a range of 10 μm to 50 μm. An excessively great distance has substantially less difference in comparison with manufacturing respective light emitting cells using separate light emitting devices, and an excessively small distance may cause difficulty in separation of light emitting cells during etching.

Figure 5A:
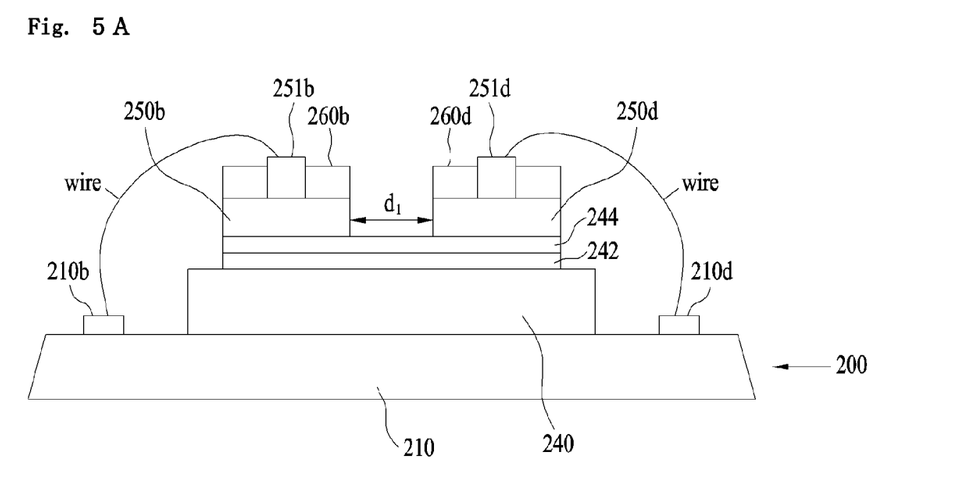
FIGS. 5A and 5B are views showing a first embodiment and a second embodiment of a configuration of light emitting cells in a light emitting structure of a light emitting device package.
Figure 5B:
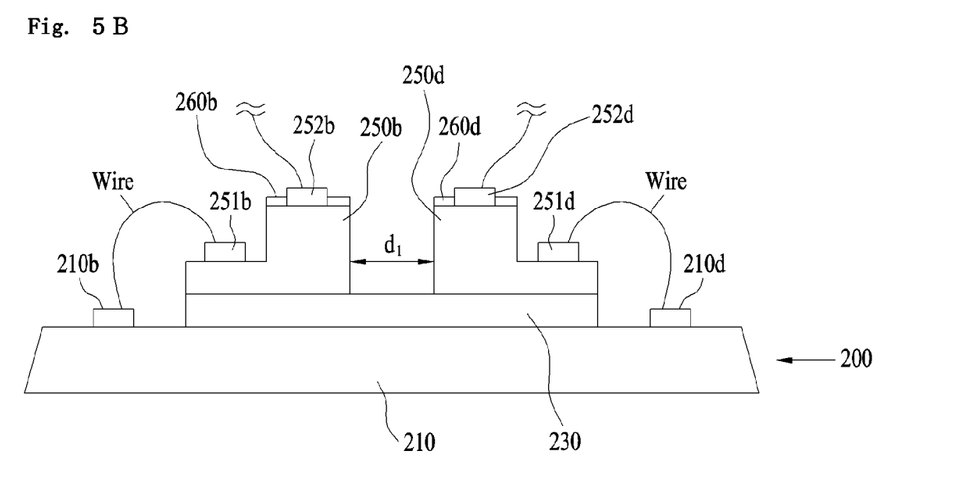

FIGS. 5A and 5B are views showing a first embodiment and a second embodiment of a configuration of light emitting cells in a light emitting structure of a light emitting device package.

FIG. 5A shows a vertical light emitting device and FIG. 5B shows a horizontal light emitting device, each light emitting device including a plurality of light emitting cells placed therein. FIGS. 5A and 5B may be vertical cross sectional views taken in direction A-A' of FIG. 4.

In FIG. 5A, two light emitting cells 250b and 250d are separately disposed above a single conductive support substrate 240 that is, in turn, disposed on a substrate 210. The light emitting cells 250b and 250d are spaced apart from each other by a predetermined distance dl. A conductive bonding layer 242 and a second electrode 244 may be sequentially stacked on the conductive support substrate 240 and the light emitting cells 250b and 250d may be disposed on the second electrode 244.

A first electrode 251b may be formed on one light emitting cell 250b. The first electrode 251b may be bonded to a first bonding pad 210b on the substrate 210 via a wire and a fluorescent substance 260b may be disposed on the light emitting cell 250b. The fluorescent substance 260b, for example, may be a green fluorescent substance.

A first electrode 251d may be formed on the other light emitting cell 250d. The first electrode 251d may be bonded to a first bonding pad 210d on the substrate 210 via a wire and a fluorescent substance 260d may be disposed on the light emitting cell 250d. The fluorescent substance 260d, for example, may be a yellow fluorescent substance.

In the vertical light emitting device of FIG. 5A, the first electrode may be formed over a first conductive semiconductor layer in a light emitting structure.

In FIG. 5B, two light emitting cells 250b and 250d are separately disposed on an insulating substrate 230 formed of sapphire or the like that is, in turn, disposed on a substrate 210. The light emitting cells 250b and 250d are spaced apart from each other by a predetermined distance dl.

One light emitting cell 250b may be subjected, at a region thereof, to mesa-etching such that a first electrode 251b is disposed on the mesa-etched region, and a second electrode 252b may be formed on the light emitting cell 250b. The first electrode 251b may be bonded to a first bonding pad 210b on the substrate 210 via a wire, the second electrode 252b may be bonded to a second bonding pad (not shown) on the substrate 210 via a wire, and a fluorescent substance 260b may be disposed on the light emitting cell 250b. The fluorescent substance 260b, for example, may be a green fluorescent substance.

The other light emitting cell 250d may be subjected, at a region thereof, to mesa-etching such that a first electrode 251d is formed on the mesa-etched region, and a second electrode 252d may be formed on the light emitting cell 250d. The first electrode 251d may be bonded to a first bonding pad 210d on the substrate 210 via a wire, the second electrode 252d may be bonded to a second bonding pad (not shown) on the substrate 210 via a wire, and a fluorescent substance 260d may be disposed on the light emitting cell 250d. The fluorescent substance 260d, for example, may be a yellow fluorescent substance.

In the horizontal light emitting device of FIG. 5B, each light emitting cell is mesa-etched such that a second conductive semiconductor layer, an active layer and a portion of a first conductive semiconductor layer are etched to expose a portion of the first conductive semiconductor layer. Then, a second electrode and a first electrode may be disposed respectively on the second conductive semiconductor layer in an unetched region and the exposed first conductive semiconductor layer in the etched region of the light emitting cell.

In the above-described light emitting device packages, the first electrodes and the second electrodes, connected to the respective light emitting cells, may be connected in parallel or may be independent of each other, thereby allowing the respective light emitting cells to be driven individually. As will be appreciated from, e.g., FIGS. 5A and 5B, the fluorescent substances may take the form of a conformal coating or a film.

The light emitting device package according to the present embodiment in which a plurality of light emitting cells is formed in a single light emitting device may emit various colors of light within a narrow space and employ a reduced number of light emitting devices, which, in turn, enables change of design in a limited space on the substrate and reduction of manufacturing costs.

Figure 6A:
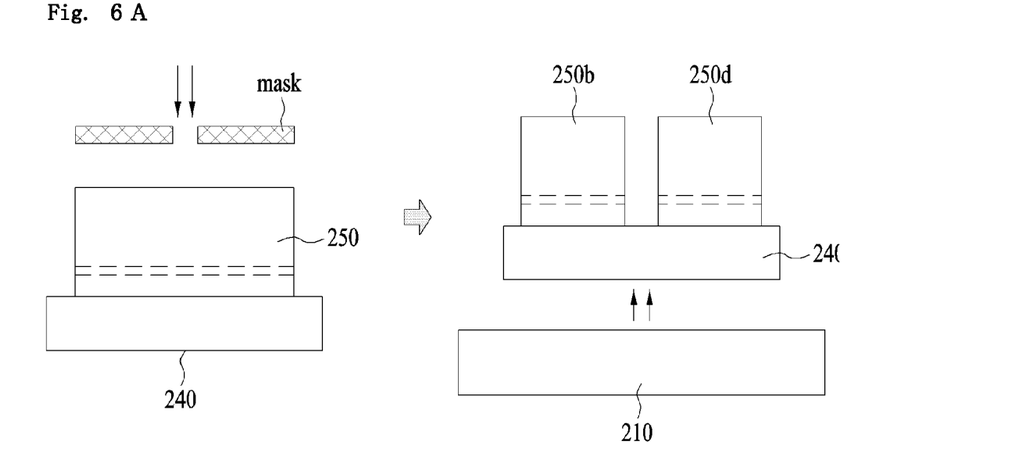
FIGS. 6A and 6B are views showing a first embodiment and a second embodiment of a manufacturing process of light emitting cells in a light emitting structure of a light emitting device package.
Figure 6B:
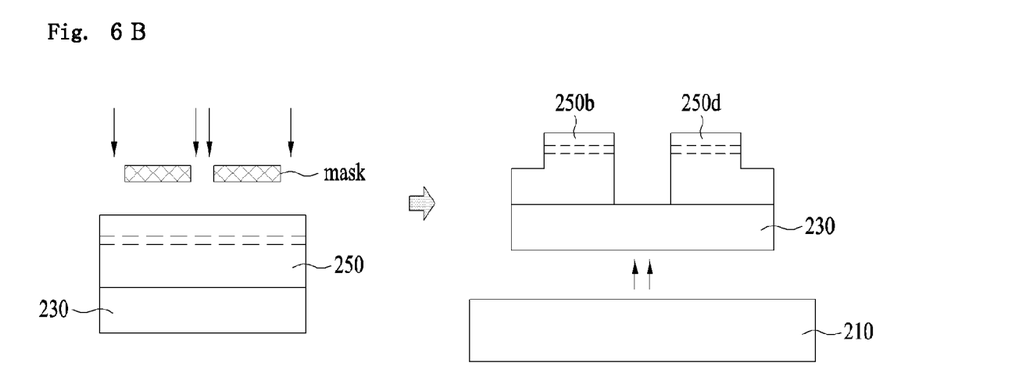

FIGS. 6A and 6B are views showing a first embodiment and a second embodiment of a manufacturing process of light emitting cells in a light emitting structure of a light emitting device package.

A light emitting structure including a first conductive semiconductor layer, an active layer and a second conductive semiconductor layer may be grown and then divided into a plurality of light emitting cells via etching that will be described below.

FIG. 6A shows division of light emitting cells in a vertical light emitting device. A light emitting structure 250 may be disposed on a conductive semiconductor substrate 240 that is in turn disposed on a substrate 210. The light emitting structure 250 may be selectively etched using a mask to thereby be divided into two light emitting cells 250b and 250d as exemplarily shown in the right side of the drawing.

More specifically, the light emitting structure 250 may be grown on a growth substrate (not shown) and mounted on the conductive support substrate 240. After the growth substrate is removed via LLO or the like, the light emitting structure 250 is divided into unit cells by etching and formation of electrodes, application of fluorescent substances and the like may be performed.

Then, as exemplarily shown in the right side of the drawing, the conductive support substrate 240 is mounted on the substrate 210 and wire bonding and the like may be performed.

In another embodiment, after the conductive support substrate 240 including the light emitting structure 250 mounted thereon is fixed on the substrate 210, the light emitting structure 250 is divided into unit cells and formation of electrodes, application of fluorescent substances and the like may be performed.

FIG. 6B shows division of light emitting cells in a horizontal light emitting device. A light emitting structure 250 may be disposed on an insulating substrate 230 and selectively etched using a mask or via mesa-etching to thereby be divided into two light emitting cells 250b and 250d as exemplarily shown in the right side of the drawing. Subsequently, some regions of the respective light emitting cells 250b and 250d may be mesa-etched.

Then, after the insulating substrate 230 is mounted on the substrate 210 as exemplarily shown in the right side of the drawing, wire bonding and the like may be performed.

In another embodiment, after the insulating substrate 230 is mounted on the substrate 210, the above-described etching process may be performed.

Figure 7:
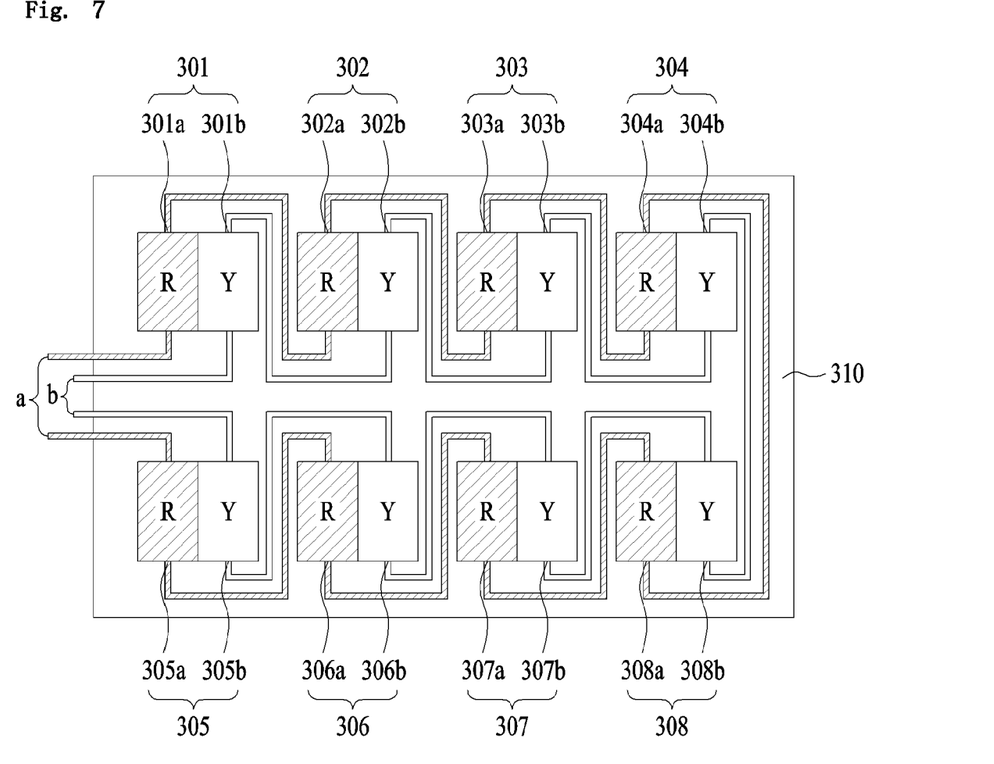
FIG. 7 is a view showing one embodiment of arrangement of light emitting devices in a lighting device for vehicles.

FIG. 7 is a view showing one embodiment of arrangement of light emitting devices in a lighting device for vehicles.

A light emitting device package according to the present embodiment includes eight light emitting devices 301 to 308 disposed on a substrate 310 and the light emitting devices 301 to 308 respectively include two light emitting cells 301a/301b to 308a/308b.

For example, first light emitting cells 301a to 308a may emit red light R and second light emitting cells 301b to 308b may emit yellow light Y. The red light R and yellow light Y may be acquired via combination of light emitted from an active layer in each light emitting device and light emitted from an excited fluorescent substance on the light emitting device.

Although FIG. 7 shows the first light emitting cells 301a to 308a and the second light emitting cells 301b to 308b as coming into contact with each other, the first light emitting cells 301a to 308a and the second light emitting cells 301b to 308b of the respective light emitting devices 301 to 308 may be spaced apart from each other by a predetermined distance as described above.

In addition, the first light emitting cells 301a to 308a and the second light emitting cells 301b to 308b may be driven independently of each other. In FIG. 7, the first light emitting cells 301a to 308a may be connected to one line a and the second light emitting cells 301b to 308b may be connected to the other line b.

The lighting device for vehicles, which includes the light emitting device package shown in FIG. 7, more particularly, a rear lamp for vehicles may emit red light using the eight first light emitting cells 301a to 308a upon receiving current applied to the line a. In particular, the red light may indicate a break signal. In addition, the rear lamp may emit yellow light using the eight second light emitting cells 301b to 308b upon receiving current applied to the line b. In particular, the yellow light may indicate a break signal.

Hereinafter, a second embodiment to a fifth embodiment of a light emitting device package will be described. In the light emitting device package according to the embodiments, each light emitting device disposed on a substrate may be divided into a plurality of light emitting cells and fluorescent substances to emit light of a plurality of wavelength ranges may be disposed on the respective light emitting cells. As such, the single light emitting device may emit light of the different wavelength ranges. In addition, the light emitting cells are arranged in any of various shapes rather than a rectangular or square shape, thus achieving a light source having any of various shapes.

Figure 8:
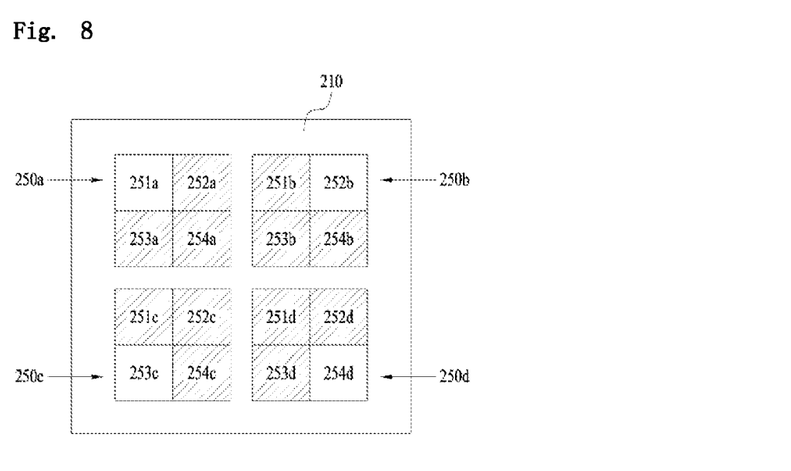
FIGS. 8 and 9 are views showing a second embodiment and a third embodiment of a light emitting device package.
Figure 9:
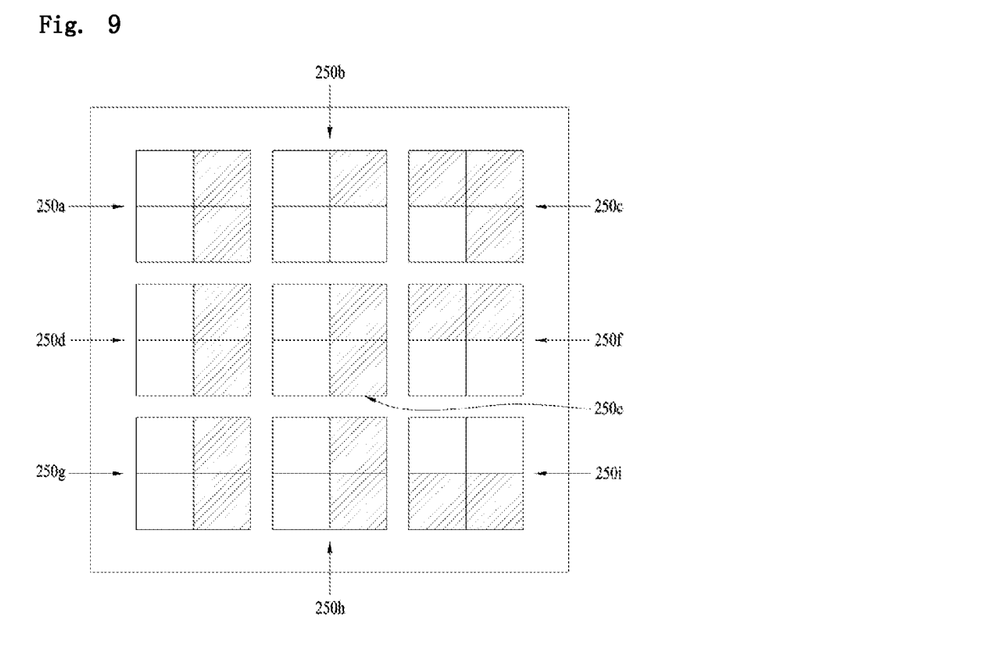

FIGS. 8 and 9 are views showing a second embodiment and a third embodiment of a light emitting device package.

The light emitting device package according to the second embodiment includes a first light emitting device to a fourth light emitting device 250a, 250b, 250c and 250d disposed on a substrate 210. The first light emitting device 250a may include four light emitting cells 251a, 252a, 253a and 254a, the second light emitting device 250b may include four light emitting cells 251b, 252b, 253b and 254b, the third light emitting device 250c may include four light emitting cells 251c, 252c, 253c and 254c, and the fourth light emitting device 250d may include four light emitting cells 251d, 252d, 253d and 254d.

A first fluorescent substance may be disposed on one light emitting cell 251a, 252b, 253c or 254d of each of the first to fourth light emitting devices 250a, 250b, 250c and 250d, and a second fluorescent substance may be disposed on the other light emitting cells. The first fluorescent substance and the second fluorescent substance are adapted to emit light of a first wavelength range and light of a second wavelength range when excited by light emitted from active layers of the respective light emitting devices 250a, 250b, 250c and 250d. Thus, the light emitting cells provided with the first fluorescent substance may outwardly emit a mixture of light emitted from the active layer and light of the first wavelength range, and the light emitting cells provided with the second fluorescent substance may outwardly emit a mixture of light emitted from the active layer and light of the second wavelength range.

The light emitting device package according to the third embodiment may include a first light emitting device to a ninth light emitting device 250a to 250i disposed on a substrate 210, and the light emitting devices 250a to 250i may respectively include four light emitting cells.

The light emitting cells of the respective light emitting devices 250a to 250i may be sorted into two kinds of light emitting cells to emit light of different wavelength ranges. Similar to the light emitting device package according to the above-described second embodiment, different fluorescent substances to emit light of different wavelength ranges may be disposed on the respective light emitting cells.

In addition, some of the light emitting cells may be provided with the fluorescent substance and the other light emitting cells may be provided with no fluorescent substance. The light emitting cells may be spaced apart from one another by different distances. That is, a distance between the light emitting cells of the same light emitting device may be less than a distance between the light emitting cells of the neighboring light emitting devices.

In the embodiment shown in FIG. 9, when light is emitted from the active layers of the respective light emitting devices 250a to 250i, the fluorescent substances on the respective light emitting cells are excited by the light emitted from the active layers, thereby emitting light of a first wavelength range and light of a second wavelength range. Thus, the light emitting cells included in a single light emitting device may outwardly emit two kinds of light.

In the embodiment shown in FIG. 8, light emitted from the entire light emitting device package may indicate a specific shape of light source. In the embodiment shown in FIG. 9, light emitted from the entire light emitting device package may be seen in the shape of number "12". Accordingly, as light emitting devices in a light emitting device package are respectively divided into a plurality of light emitting cells and different kinds of fluorescent substances are disposed on the light emitting cells, one light emitting device or the light emitting device package may have any of various shapes rather than a rectangular or square shape, and these shapes may indicate any of specific emblems, such as symbols, letters, numbers or the like.

Figure 10A:
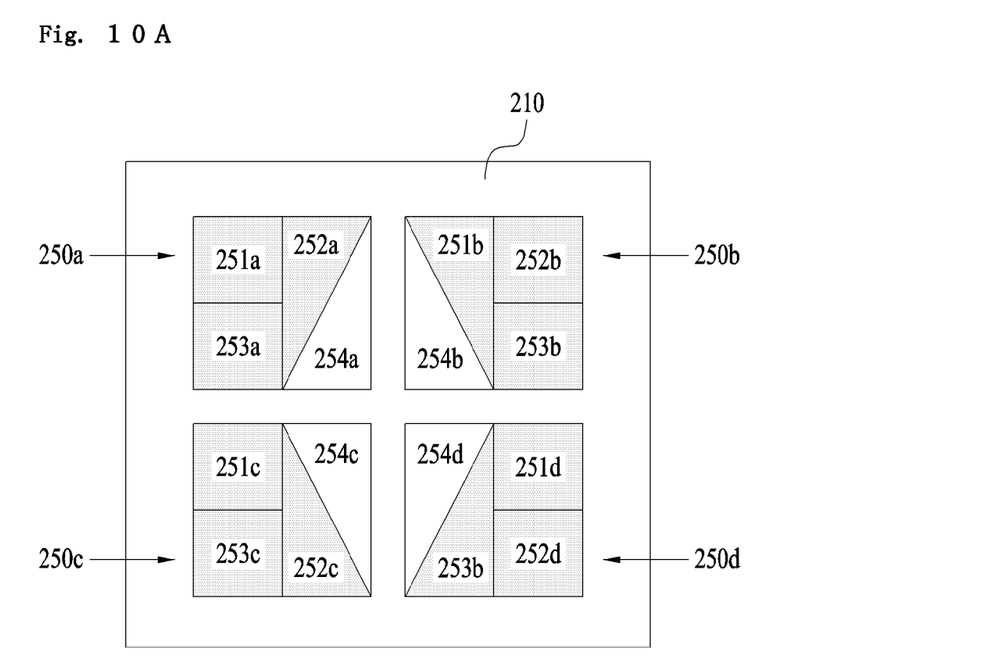
FIGS. 10A and 10B are views showing on and off states of a fourth embodiment of a light emitting device package.
Figure 10B:
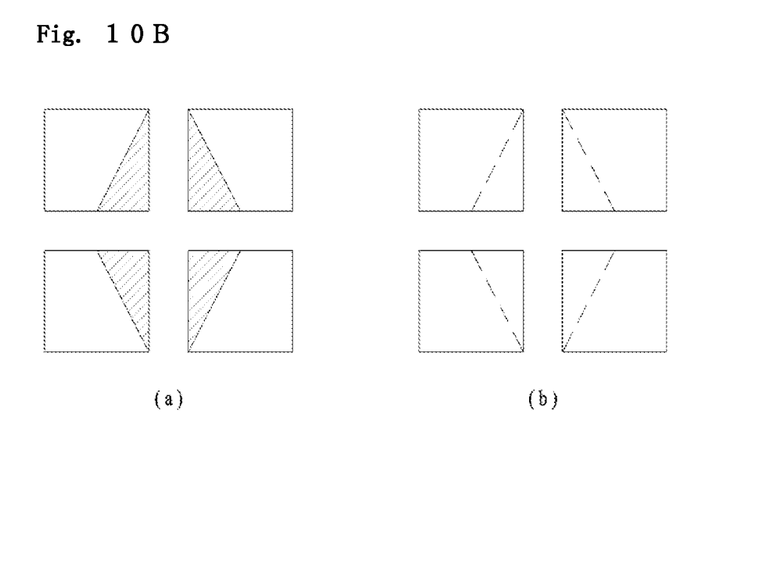

FIGS. 10A and 10B are views showing on and off states of a fourth embodiment of a light emitting device package.

Although the light emitting device package according to the fourth embodiment is similar to the light emitting device package shown in FIG. 8 based on the fact that a single light emitting device includes four light emitting cells, in the present embodiment, all of the light emitting cells may not be identical to one another in terms of an area and/or a shape in comparison with FIGS. 8 and 9 in which all of the light emitting cells have the same area and shape.

The light emitting device package according to the fourth embodiment includes first to fourth light emitting devices 250a, 250b, 250c and 250d on a substrate 210. The first light emitting device 250a may include two square light emitting cells 251a and 253a and two triangular light emitting cells 252a and 254a, the second light emitting device 250b may include two square light emitting cells 252b and 253b and two triangular light emitting cells 251b and 254b, the third light emitting device 250c may include two square light emitting cells 251c and 253c and two triangular light emitting cells 252c and 254c, and the fourth light emitting device 250d may include two square light emitting cells 251d and 252d and two triangular light emitting cells 253d and 254d.

One light emitting cell 254a in the first light emitting device 250a, one light emitting cell 254b in the second light emitting device 250b, one light emitting cell 254c in the third light emitting device 250c and one light emitting cell 254d in the fourth light emitting device 250d are provided with a fluorescent substance that is a different kind from that of the other light emitting cells. Different kinds of fluorescent substances emit light of different wavelength ranges when excited by light emitted from active layers of light emitting devices. Thus, a wavelength of light emitted from the four light emitting cells 254a, 254b, 254c and 254d differs from a wavelength of light emitted from the other light emitting cells.

Accordingly, as exemplarily shown in (a) of FIG. 10B, four light emitting devices may indicate emblems corresponding to a leftward arrow and/or a rightward arrow upon receiving current. In particular, when the light emitting device package is used in a lighting device for vehicles, direction indicating emblems may be indicated. In (b) of FIG. 10B, the case of supplying no current to the light emitting devices is shown.

Figure 11A:
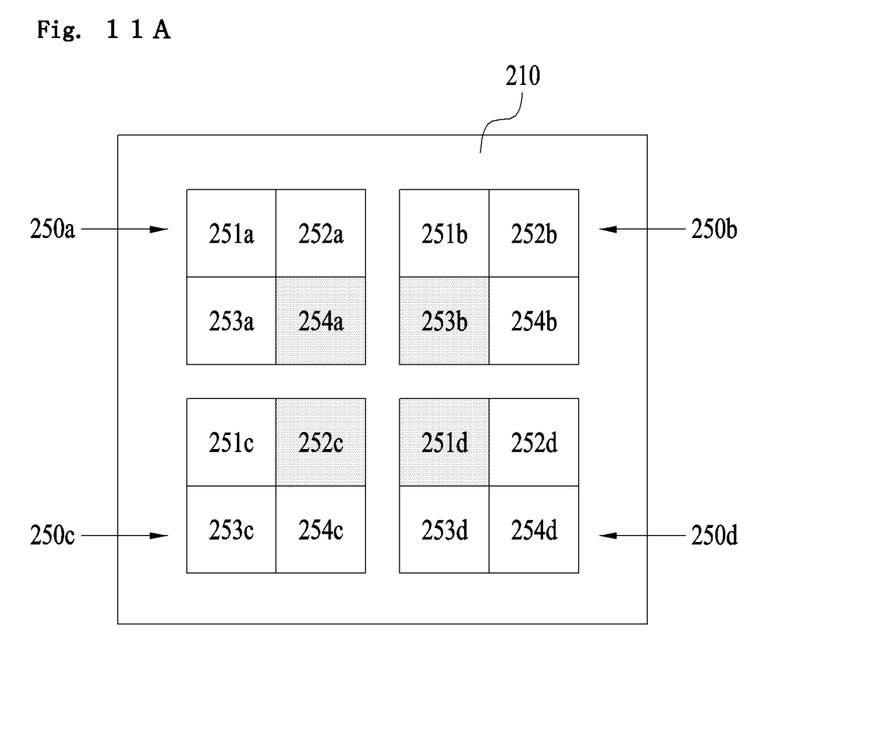
FIGS. 11A and 11B are views showing on and off states of a fifth embodiment of a light emitting device package.
Figure 11B:
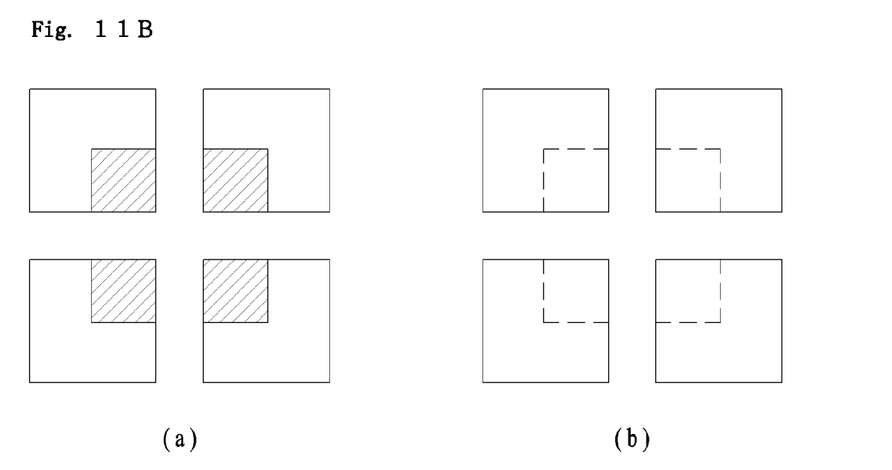

FIGS. 11A and 11B are views showing on and off states of a fifth embodiment of a light emitting device package.

The light emitting device package according to the fifth embodiment is similar to that of the above-described fourth embodiment, but has a difference that one light emitting device includes four light emitting cells having the same area and shape.

A first light emitting device 250a may include four light emitting cells 251a, 252a, 253a and 254a, a second light emitting device 250b may include four light emitting cells 251b, 252b, 253b and 254b, a third light emitting device 250c may include four light emitting cells 251c, 252c, 253c and 254c, and a fourth light emitting device 250d may include four light emitting cells 251d, 252d, 253d and 254d.

A first fluorescent substance may be disposed on one light emitting cell 254a, 253b, 252c or 251d of each of the first light emitting device to the fourth light emitting device 250a, 250b, 250c and 250d, and a second fluorescent substance may be disposed on the other light emitting cells. The first fluorescent substance and the second fluorescent substance respectively emit light of a first wavelength range and light of a second wavelength range when excited by light emitted from active layers of the respective light emitting devices 250a, 250b, 250c and 250d. Thus, the light emitting cells provided with the first fluorescent substance may outwardly emit a mixture of light emitted from the active layer and light of the first wavelength range, and the light emitting cells provided with the second fluorescent substance may outwardly emit a mixture of light emitted from the active layer and light of the second wavelength range.

Accordingly, as exemplarily shown in (a) of FIG. 11B, center four light emitting cells and peripheral light emitting cells indicate different colors when current is supplied to the light emitting devices and, thus, the light emitting devices may constitute, e.g., a signal lamp for a specific emblem or for a specific purpose. For example, in a lighting device for vehicles, a brake lamp and a signal lamp may be integrated to be selectively or wholly turned on or off. In (b) of FIG. 11B, the case of supplying no current to the light emitting devices is shown.

Figure 12A:
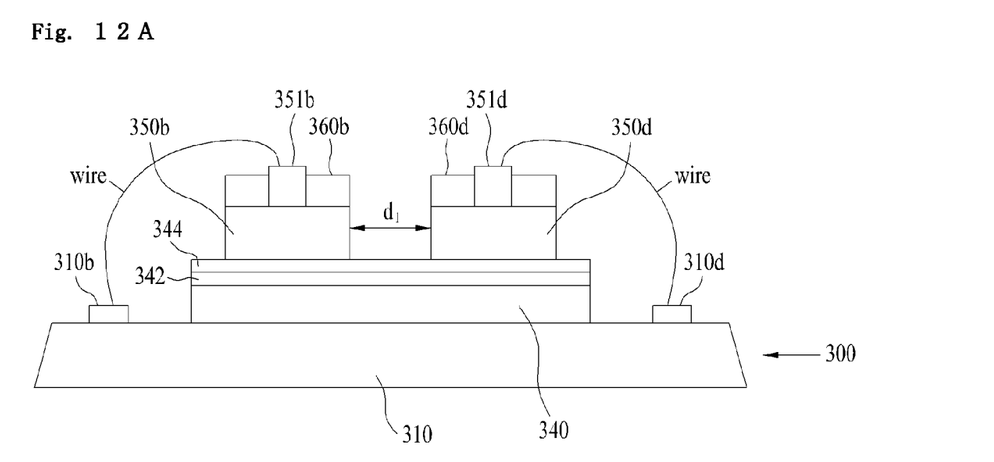
FIGS. 12A and 12B are views showing a second embodiment to a fifth embodiment of a configuration of light emitting cells in a light emitting structure of a light emitting device package.
Figure 12B:
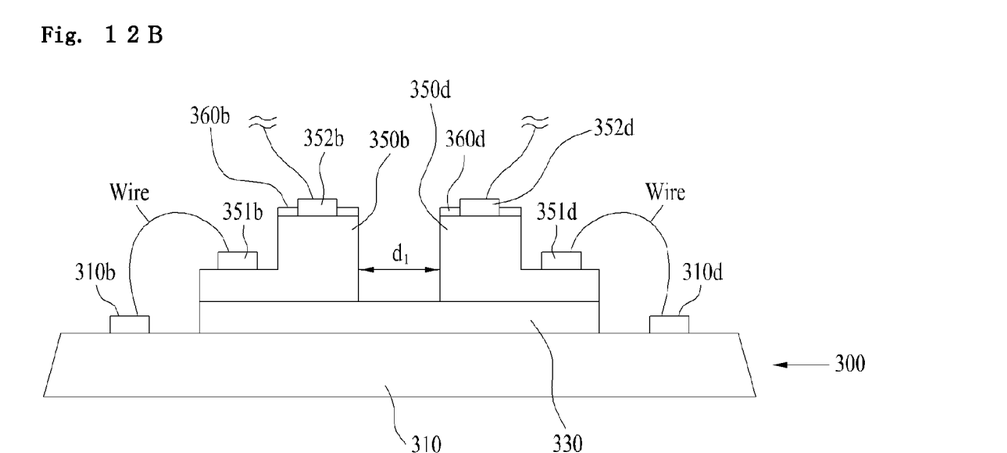

FIGS. 12A and 12B are views showing different configurations of light emitting cells in a light emitting structure of a light emitting device package.

FIG. 12A shows a vertical light emitting device and FIG. 12B shows a horizontal light emitting device, each light emitting device including a plurality of light emitting cells placed therein. FIGS. 12A and 12B may be vertical cross sectional views taken along direction A-A' of FIG. 4.

In FIG. 12A, two light emitting cells 350b and 350d are separately disposed above a single conductive support substrate 340 that is in turn disposed on a substrate 310. The light emitting cells 350b and 350d are spaced apart from each other by a predetermined distance dl. A conductive bonding layer 342 and a second electrode 344 may be disposed on the conductive support substrate 340 and the light emitting cells 350b and 350d may be disposed on the second electrode 344.

The predetermined distance dl may be within a range of 10 µm to 50 µm. An excessively great distance has substantially less difference in comparison with manufacturing respective light emitting cells using separate light emitting devices, and an excessively small distance may cause difficulty in separation of light emitting cells during etching.

A first electrode 351b may be formed on one light emitting cell 350b. The first electrode 351b may be bonded to a first bonding pad 310b on the substrate 310 via a wire and a fluorescent substance 360b may be disposed on the light emitting cell 350b. The fluorescent substance 360b, for example, may be a green fluorescent substance.

A first electrode 351d may be formed on the other light emitting cell 350d. The first electrode 351d may be bonded to a first bonding pad 310d on the substrate 310 via a wire and a fluorescent substance 360d may be disposed on the light emitting cell 350d. The fluorescent substance 360d, for example, may be a yellow fluorescent substance.

In the vertical light emitting device of FIG. 12A, the first electrode may be formed on a first conductive semiconductor layer in a light emitting structure.

In FIG. 12B, two light emitting cells 350b and 350d are separately disposed on an insulating substrate 330 formed of sapphire or the like that is in turn disposed on a substrate 310. The light emitting cells 350b and 350d are spaced apart from each other by a predetermined distance dl.

One light emitting cell 350b may be subjected, at a region thereof, to mesa-etching such that a first electrode 351b is formed on the mesa-etched region, and a second electrode 352b may be formed on the light emitting cell 350b. The first electrode 351b may be bonded to a first bonding pad 310b on the substrate 310 via a wire, the second electrode 352b may be bonded to a second bonding pad (not shown) on the substrate 310 via a wire, and a fluorescent substance 360b may be disposed on the light emitting cell 350b. The fluorescent substance 360b, for example, may be a green fluorescent substance.

The other light emitting cell 350d may be subjected, at a region thereof, to mesa-etching such that a first electrode 351d is formed on the mesa-etched region, and a second electrode 352d may be formed on the light emitting cell 350d. The first electrode 351d may be bonded to a first bonding pad 310d on the substrate 310 via a wire, the second electrode 352d may be bonded to a second bonding pad (not shown) on the substrate 310 via a wire, and a fluorescent substance 360d may be disposed on the light emitting cell 350d. The fluorescent substance 360d, for example, may be a yellow fluorescent substance.

In the horizontal light emitting device of FIG. 12B, each light emitting cell is mesa-etched such that a second conductive semiconductor layer, an active layer and a portion of a first conductive semiconductor layer are etched to expose a portion of the first conductive semiconductor layer. Then, a second electrode and a first electrode may be disposed respectively on the second conductive semiconductor layer in an unetched region and the exposed first conductive semiconductor layer in the etched region of the light emitting cell.

In the above-described light emitting device packages, the first electrodes and the second electrodes, connected to the respective light emitting cells, may be connected in parallel or may be independent of each other, thereby allowing the respective light emitting cells to be driven individually. As will be appreciated from, e.g., FIGS. 12A and 12B, the fluorescent substances may take the form of a conformal coating or a film.

Figure 13A:
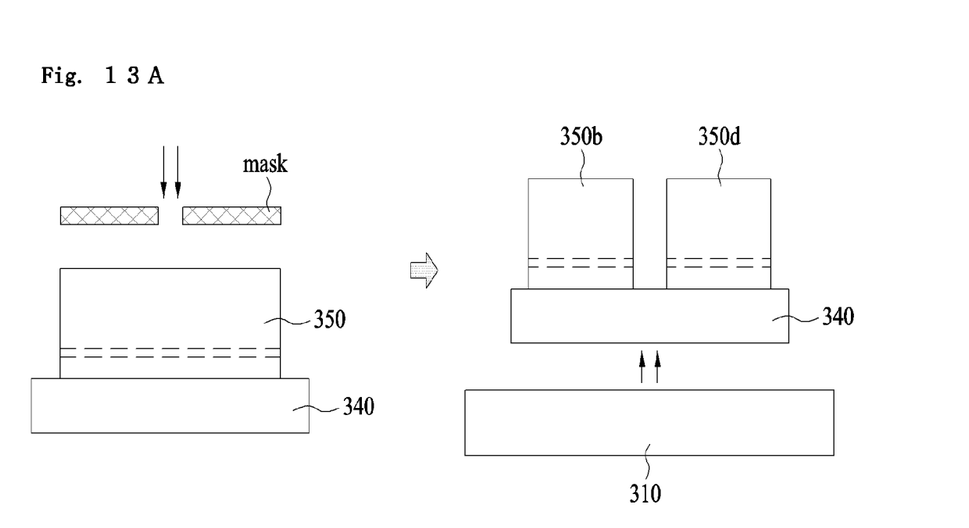
Figure 13B:
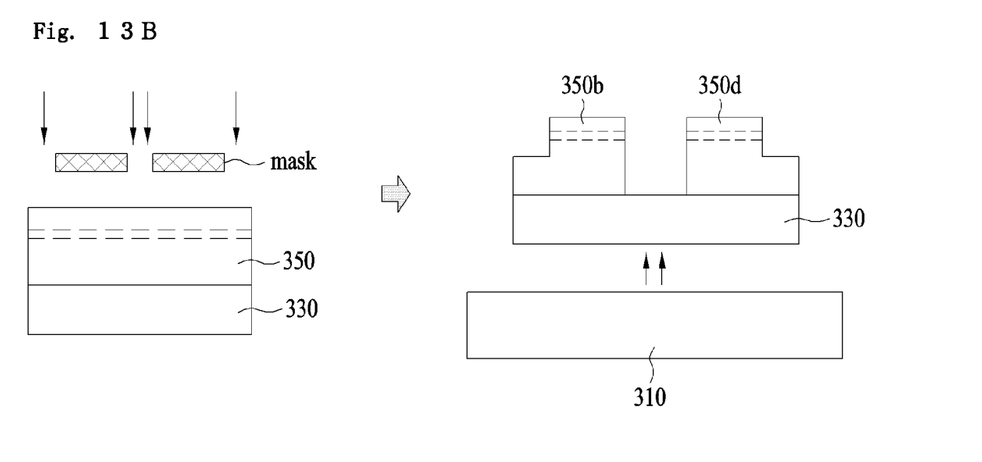
Figure 14:
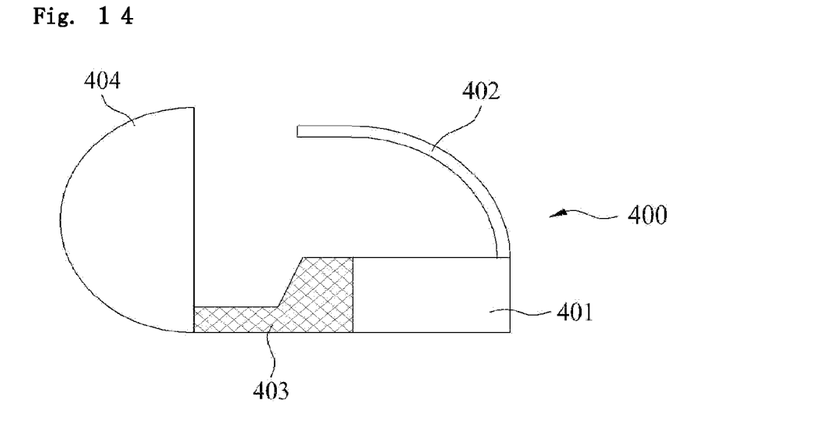
FIG. 14 is a view showing one embodiment of a lighting device for vehicles containing the light emitting device package according to the above-described embodiments.

FIGS. 13A and 13B are views showing a manufacturing process of the light emitting cells shown in FIGS. 12A and 12B and may be identical to the embodiment shown in FIGS. 6A and 6B. FIG. 14 is a view showing one embodiment of a lighting device for vehicles containing a light emitting device package.

A lighting device 400 for vehicles according to the embodiment may be configured in such a way that light emitted from a light emitting device module 401 having a light emitting device package is reflected by a reflector 402 and a shade 403 and then passes through a lens 404 to thereby be directed to the rear of a vehicle body. The light emitting device module 401 may include the above-described light emitting device package disposed on a board.

In the above-described lighting device for vehicles, light emitting devices in the light emitting device module may respectively include a plurality of light emitting cells and each light emitting device may emit light of two wavelength ranges.

As is apparent from the above description, a light emitting device package in which a single light emitting device defines a plurality of light emitting cells may emit light of various colors within a narrow space. In addition, the light emitting device package may employ a reduced number of light emitting devices, which enables change of design in a limited space on the substrate and reduction of manufacturing costs.

In addition, as a result of each light emitting device being divided into a plurality of light emitting cells and different kinds of fluorescent substances being disposed on the light emitting cells, one light emitting device or the light emitting device package may have any of various shapes rather than a rectangular or square shape, and these shapes may indicate any of specific emblems, such as symbols, letters, numbers or the like.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
 a package body;
 a light emitting structure disposed on the package body, the light emitting structure including a first conductive semiconductor layer, an active layer and a second conductive semiconductor layer, the light emitting structure being divided into at least two light emitting cells;
 a support substrate located between the package body and the light emitting structure;
 a first electrode and a second electrode connected to each of the light emitting cells; and
 fluorescent substances disposed on, and separated along, each of the light emitting cells,
 wherein at least two layers among the first conductive semiconductor layer, the active layer and the second conductive semiconductor layer included in each of the light emitting cells next to each other are electrically separated from each other.

2. The package according to claim 1, wherein the respective light emitting cells emit light of the same wavelength range, and at least some portions of the fluorescent substances disposed respectively on the light emitting cells emit light of different wavelength ranges.

3. The package according to claim 1, wherein the fluorescent substances take the form of a conformal coating or a film.

4. The package according to claim 1, wherein a distance of the light emitting cells next to each other is 10 μm to 50 μm.

5. The package according to claim 1, further comprising a substrate for placement of the light emitting structure,
 wherein each of the light emitting cells is mesa-etched such that the second conductive semiconductor layer, the active layer and a portion of the first conductive semiconductor layer are etched to expose a portion of the first conductive semiconductor layer, and the second electrode and the first electrode are respectively disposed on the second conductive semiconductor layer in an unetched region and the exposed first conductive semiconductor layer in an etched region of the light emitting cell.

6. The package according to claim 5, further comprising a conductive support substrate for placement of the light emitting structure,
 wherein the first electrode is disposed on the first conductive semiconductor layer of each of the light emitting cells.

7. A lighting device for a vehicle comprising:
 a circuit board;
 a light emitting device package disposed on the circuit board, the light emitting device package including:
 a package body;
 at least one light emitting structure disposed on the package body, the light emitting structure including a first conductive semiconductor layer, an active layer and a second conductive semiconductor layer, the light emitting structure being divided into at least two light emitting cells;
 a support substrate located between the package body and the light emitting structure;
 a first electrode and a second electrode connected to each of the light emitting cells; and
 fluorescent substances disposed respectively on the light emitting cells, wherein at least two layers among the first conductive semiconductor layer, the active layer and the second conductive semiconductor layer included in each of the light emitting cells next to each other are electrically separated from each other; and
 a lens disposed on the light emitting device package,
 wherein the at least one light emitting structure includes two or more light emitting structures, each of the light emitting structures is configured to emit light of a blue wavelength range, and the respective light emitting cells are provided with at least a yellow fluorescent substance and a red fluorescent substance.

8. The device according to claim 7, wherein each of the light emitting structures includes a first light emitting cell provided with the yellow fluorescent substance and a second light emitting cell provided with a red fluorescent substance, and the first light emitting cell and the second light emitting cell in the light emitting structure are equally arranged.

9. The device according to claim 7, wherein the first light emitting cell and the second light emitting cell are driven independently of each other.

10. A light emitting device package comprising:
 a package body;
 at least one light emitting structure disposed on the package body, the light emitting structure including a first conductive semiconductor layer, an active layer and a second conductive semiconductor layer, the light emitting structure being divided into at least two light emitting cells;
 a first electrode and a second electrode connected to each of the light emitting cells; and
 fluorescent substances disposed respectively on at least some portions of the light emitting cells,
 wherein the light emitting cells differ from one another in terms of at least one of a shape of the cells and a distance between the cells, and
 wherein the active layers of the respective light emitting cells emit light of the same wavelength range, and at least some portions of the fluorescent substances disposed respectively on the light emitting cells emit light of different wavelength ranges.

11. The package according to claim 10, wherein the respective light emitting cells have a square shape or a triangular shape.

12. The package according to claim 10, wherein the light emitting cells include a first light emitting cell provided with a first fluorescent substance to emit light of a first wavelength range and a second light emitting cell provided with a second fluorescent substance to emit light of a second wavelength range, and at least one of the first light emitting cell and the second light emitting cell indicates a specific emblem.

13. The package according to claim 10, wherein the light emitting cells have different shapes.

14. The package according to claim 10, wherein the light emitting cells have the same shape.

15. The package according to claim 10, wherein the light emitting cells are formed by growing a single light emitting structure and then dividing the grown light emitting structure via etching.

16. The package according to claim 10, wherein the fluorescent substances take the form of a conformal coating or a film.

17. The package according to claim 10, wherein a distance of the light emitting cells next to each other is 10 μm to 50 μm.

18. The package according to claim 10, wherein the at least one light emitting structure includes a first light emitting structure and a second light emitting structure, and some light emitting cells in the first light emitting structure and some light emitting cells in the second light emitting structure indicate a direction indicating emblem.

19. The package according to claim 18, wherein some light emitting cells in the first light emitting structure and some light emitting cells in the second light emitting structure indicate a break signal emblem.

* * * * *